(12) United States Patent
Kwan et al.

(10) Patent No.: US 6,715,496 B2
(45) Date of Patent: Apr. 6, 2004

(54) METHOD AND APPARATUS FOR CLEANING A SEMICONDUCTOR WAFER PROCESSING SYSTEM

(75) Inventors: Michael Chiu Kwan, Redwood City, CA (US); Alan W. Collins, San Francisco, CA (US); Jalel Hamila, San Jose, CA (US); Padmanabhan Krishnaraj, San Francisco, CA (US); Zhengquan Tan, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/407,525

(22) Filed: Apr. 3, 2003

(65) Prior Publication Data

US 2003/0164224 A1 Sep. 4, 2003

Related U.S. Application Data

(63) Continuation of application No. 09/494,327, filed on Jan. 28, 2000, now Pat. No. 6,596,123.

(51) Int. Cl.⁷ ................................................ B08B 7/04
(52) U.S. Cl. ...................... 134/1.1; 134/22.18; 438/905
(58) Field of Search ................................. 134/1.1, 1, 21, 134/22.1, 22.18; 438/905; 156/345.1

(56) References Cited

U.S. PATENT DOCUMENTS

| 4,820,377 | A | | 4/1989 | Davis et al. ................ 156/643 |
| 5,911,833 | A | * | 6/1999 | Denison et al. .............. 134/1.1 |
| 5,988,187 | A | * | 11/1999 | Trussell et al. ............ 134/22.1 |
| 6,274,058 | B1 | * | 8/2001 | Rajagopalan et al. ......... 216/67 |
| 6,374,833 | B1 | * | 4/2002 | Yuan et al. .................. 134/1.1 |
| 6,596,123 | B1 | * | 7/2003 | Kwan et al. ............. 156/345.1 |

FOREIGN PATENT DOCUMENTS

| EP | 0 799 999 | 10/1997 | ........... F04D/29/02 |

* cited by examiner

*Primary Examiner*—Alexander Markoff
(74) *Attorney, Agent, or Firm*—Moser, Patterson & Sheridan

(57) ABSTRACT

A method and apparatus for cleaning a semiconductor wafer processing system comprising a turbomolecular pump. In one embodiment, the invention may be reduced to practice by first supplying a cleaning agent to a chamber; pumping the cleaning agent from the chamber through an the exhaust port; at least partially opening a gate valve; and drawing at least a portion of the cleaning agent through the gate valve and into the turbomolecular pump.

12 Claims, 2 Drawing Sheets

METHOD AND APPARATUS FOR CLEANING A SEMICONDUCTOR WAFER PROCESSING SYSTEM

RELATED APPLICATIONS

This application is a continuation of U.S. patent application Ser. No. 09/494,327, filed Jan. 28, 2000 U.S. Pat. No. 6,596,123, which is hereby incorporated by reference in its entirety.

BACKGROUND OF THE DISCLOSURE

1. Field of Invention

The present invention relates generally to a method and apparatus for cleaning a semiconductor processing system. More specifically, the invention relates to a method of cleaning a semiconductor process system comprising a turbomolecular pump coupled to a process chamber, using a fluorinated gas.

2. Description of the Background Art

Integrated circuits have evolved into complex devices that can include millions of transistors, capacitors and resistors on a single chip. The evolution of chip designs continually demands faster circuitry, greater circuit density, and increased functionality. As the circuit density decreases, it has become increasingly important to create the circuit structures precisely and repeatably in order to effectively utilize thinner films. In order to obtain precision and repeatability in circuit structures from wafer to wafer, processing windows for parameters used when forming thin films such as chamber pressure, must correspondingly be tighten and better controlled.

A material commonly used in the circuit structures utilizing thin films is phosphorous doped, silicon dioxide, commonly known as phosphorous doped glass (PSG). Phosphorous doped glass is generally used as a passivation film or as a pre-metal dielectric. Phosphorous doped glass is commonly formed by chemical vapor deposition (CVD) processes that react a silicon source (e.g., silane or tetraethylorthosilicate (TEOS)) with an oxidizing agent (e.g., $O_2$ and $HO_2$) at elevated temperatures. Phosphorous doped glass may also be formed using plasma enhanced chemical vapor deposition (PECVD) and high density plasma chemical vapor deposition (HDP-CVD) processes that allow for deposition of phosphorous doped glass at lower temperatures.

During both PECVD and HDP-CVD processes, chamber pressure has been found to drift higher over the course of deposition of phosphorous doped glass upon a wafer. This process drift is aggravated over the course of multiple depositions when processing a batch of wafers. The process drift causes variation in deposition rates across the batch, and variation in the phosphorous doping levels found in films wafer to wafer. As a result, the conformity required to produce consistent circuit structures over the course of a process run is compromised. Such non-uniformity is a limiting factor in the use of circuit structures comprising thin films.

The cause of the pressure drift is attributed in part to the contamination of a turbomolecular pump used to maintain chamber pressure during processing. During the deposition of silicon dioxide, a phosphorous containing compound adheres to the turbomolecular pump components thus reducing the pump's efficiency and ability to maintain a predetermined chamber pressure.

Typical semiconductor process systems having cleaning capability generally do not clean the turbomolecular pump. Conventional system designs rely upon the high rotational velocity and a sufficiently low pressure conditions within the turbomolecular pump to prevent deposition upon the pump components. As such, chamber cleaning processes are generally vented through a roughing pump and by-pass the turbomolecular pump. As a result, deposits within the turbomolecular pump are never removed during conventional cleaning processes. These deposits increase over time, causing the pressure characteristics of the turbomolecular pump to degrade until the turbomolecular pump becomes unsuitable for use when depositing thin films and requires replacement.

Therefore, there is a need in the art for a semiconductor process system that removes contamination from a turbomolecular pump.

SUMMARY OF INVENTION

One aspect of the invention provides a semiconductor wafer processing system comprising a chamber, a cleaning system, a pumping system coupled and a control system. The cleaning and pumping systems are coupled to the chamber. The control system is coupled to the cleaning and pumping systems. The chamber pumping system comprises a rough pump and a turbomolecular pump. The control system causes a gate valve disposed between the turbomolecular pump and the chamber to open and divert a portion of a cleaning agent to be drawn from the chamber by the rough pump through the turbomolecular pump. As the cleaning agent passes through the turbomolecular pump, the turbomolecular pump is cleaned of surface contaminants, thus enabling the turbomolecular pump to maintain substantially constant and repeatable pressures within the chamber over multiple wafer processing.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

The present invention provides a method of cleaning a semiconductor wafer processing system. The invention is generally applicable, but not exclusively, to deposition chambers of semiconductor wafer processing systems, including, for example, physical vapor deposition (PVD) or sputtering chambers, chemical vapor deposition (CVD) chambers, and ion implant chambers. The invention is also applicable wherever a turbomolecular pump is used to maintain a vacuum within the chamber having plasma processing or cleaning cycles. An example of one such chamber is a high density plasma chemical vapor deposition (HDP-CVD) chamber, such as an Ultima® High Density Chemical Vapor Deposition (HDP-CVD) system, available from Applied Materials, Inc., of Santa Clara, Calif.

Figure 1:
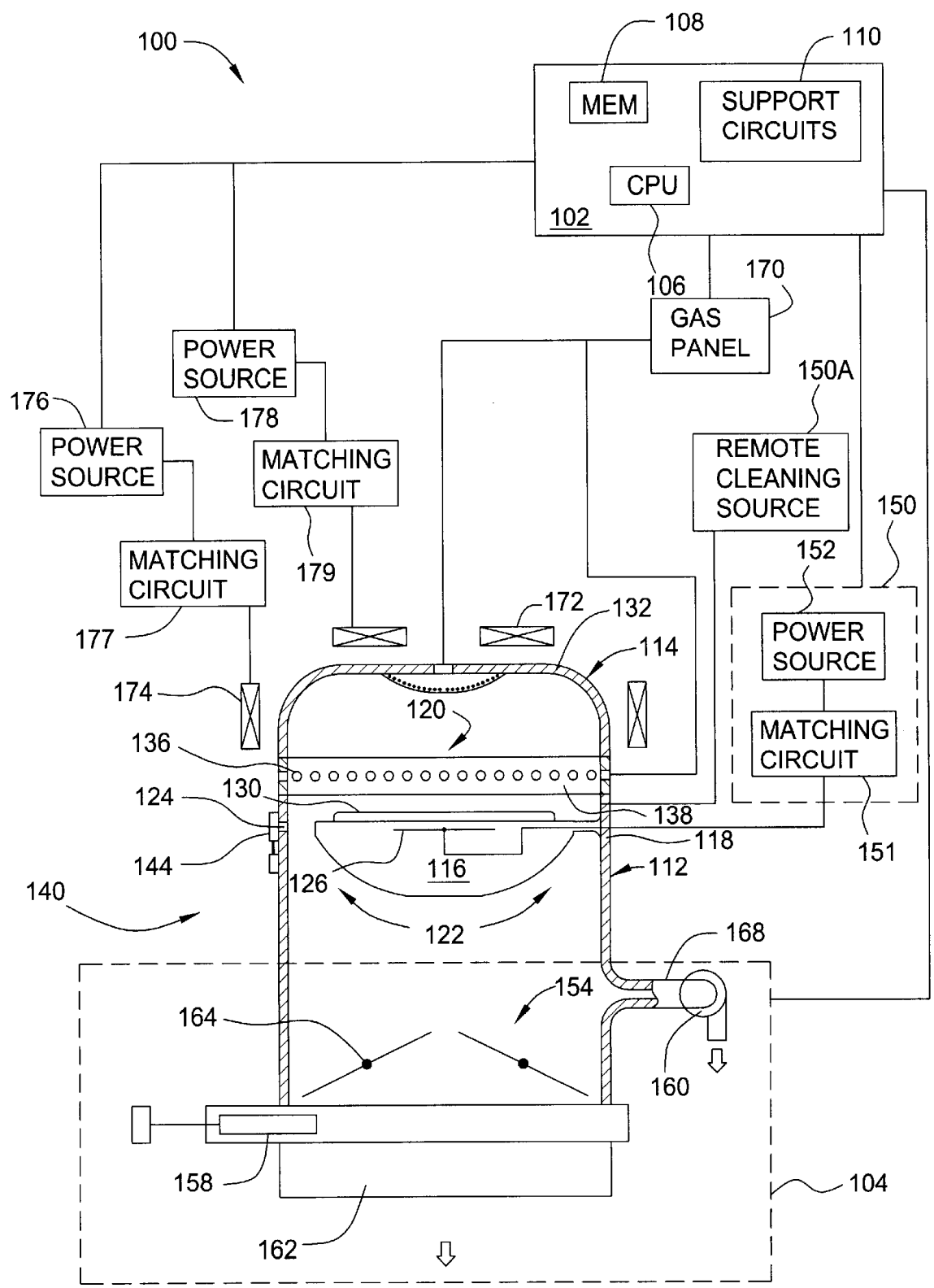
FIG. 1 depicts a schematic diagram of a plasma processing apparatus of the kind used in performing the deposition processes of the present invention.

FIG. 1 depicts a HDP-CVD system (system) 100 in which the inventive cleaning method may be reduced to practice.

The system 100 generally comprises an evacuable enclosure (chamber) 140 coupled to various sources and systems, including a gas panel 170, a controller 102, a cleaning system 150 and a pumping system 104. The chamber 140 in which substrate processing is performed, is defined by a chamber body 112 and a lid assembly 114.

The chamber body 112 is preferably a unitary, machined structure having a sidewall 118 that defines an inner annular processing region 120 and tapers towards its lower end to define a concentric exhaust passage 122. The chamber body 112 defines a plurality of ports including at least a substrate entry port 124 that is selectively sealed by a slit valve 144.

The upper surface of the chamber wall 118 defines a generally flat landing area on which the lid assembly 114 is supported. One or more o-ring grooves are formed in the upper surface of the wall to receive one or more o-rings to form an airtight seal between the chamber body 112 and the lid assembly 114.

The lid assembly 114 is generally comprised of an energy transmitting dome 132 mounted a gas distribution ring 138. O-ring grooves are formed in the top of the gas distribution ring 138 to receive an o-ring to seal the dome 132 and the top of the gas distribution ring 138. The lid assembly 114 provides both the physical enclosure of the plasma processing region 120 as well as the energy delivery system to drive processing.

The gas distribution ring 138 comprises a plurality of gas inlet ports 136. The ports 136 are coupled to a gas panel 170 that provides process and other gases to the chamber 140.

The dome 132 is generally made of a dielectric material that is transmissive to RF energy, an example of which is a ceramic such as aluminum oxide ($Al_2O_3$). Two separately powered RF coils, a top coil 172 and a side coil 174, are wound external to the dielectric dome 132. The RF coils 172 and 174 are respectively powered by a first variable frequency RF source 176 and a second variable frequency RF source 178.

A first RF matching network 177 is coupled between the first power source 176 and the coil 174, and is typically used to transfer power to a plasma formed within the chamber 140. Similarly, a second RF matching network 179 is coupled between the second power source 178 and the coil 172.

A substrate support member 116 is disposed in the chamber 140 cantilevered from the chamber wall 118. In one embodiment of the invention, the substrate support member 116 comprises one or more conducting elements or electrodes 126 imbedded therein. The electrode 126 may comprise a metallic element, green printed metalization, a mesh screen or the like. A voltage, for example about 700 Volts, is applied to the substrate support member 116 by a DC voltage source (not shown) to generate the electrostatic attraction force which holds a substrate 130 in close proximity to the upper surface of the substrate support member 116.

The substrate support member 116 also includes a temperature control system (not shown) that maintains the temperature of a substrate 130 during processing. The temperature control system preferably comprises fluid channels within the substrate support member 116 that are connected to a thermal fluid source (not shown). The controller 102 senses the temperature of the substrate 130 and changes the temperature of the thermal fluid accordingly to maintain a predetermined value. Alternatively, other heating and cooling methods, such as resistive heating, may be utilized to control the temperature of the substrate 130 during processing.

Below the support member 116 is a pumping port 154 substantially concentric with the upper surface of the support member 116. The pumping port 154 is disposed substantially centrally below the substrate receiving portion of the support member 116 to draw the gases evenly through the passage 122 and out of the chamber 140. This enables more uniform gas flow over the substrate surface about the entire circumference thereof and radially downwardly and outwardly from the chamber 140 through pumping port 154 centered in the base of the chamber 140. The passage 122 promotes uniform deposition of film layers by maintaining pressure and residence time uniformity, lacking in existing processing chambers, such as substrate locations with differing proximity in relation to the pumping port 154.

The pumping system 104 is coupled to the pumping port 154. The pumping system 104 generally provides for establishing, and maintaining a vacuum within chamber 140, along with the removal of process gases, reaction byproducts, contaminants and other gases from the chamber 140. The pumping system 104 comprises a rough pump 160 and a turbomolecular pump 162 are mounted to the pumping port 154 of the tapered lower portion of the chamber body 112. A gate valve 158 is mounted between the pumping port 154 and the turbomolecular pump 162 to permit isolation of the turbomolecular pump 162 when not in use. When the gate valve 158 is closed, the flow exiting the pumping port 154 is diverted through a foreline 168 to the rough pump 160. A throttle valve 156 is mounted between the gate valve 158 and the pumping port 154 to provide pressure control when the turbomolecular pump 162 is in use.

The cleaning system 150 comprises a RF generator 152 and a matching circuit 151. The RF generator 152 is coupled to the matching circuit 151 and the matching circuit 151 is coupled to the electrode 126 within the substrate support 116. The cleaning system 150 is typically utilized periodically to remove contaminants (i.e., oxides) from the chamber 140 as part of a maintenance program. The cleaning system 150 operates by applying RF power to the electrode 126, striking a plasma from a cleaning agent supplied to the process chamber 140 from the gas panel 170. The cleaning agent may be, for example, argon or another inert gas, or a gas comprising elemental or disassociated fluorine. The cleaning agent ionizes and subsequently etches and removes oxides that may be disposed within the chamber 140. An example of such a cleaning system is described in the commonly assigned U.S. Pat. No. 5,861,086, issued Jan. 19, 1999, by Khurana et al., and is hereby incorporated by reference in its entirety.

Alternately, the cleaning system 150 comprises a remote plasma source 150A. The remote plasma source 150A is coupled to the chamber 140 via additional side port (not shown) that is disposed through the chamber wall 118 at about the level of the upper surface of the substrate support member 116. Cleaning gases, such as disassociated fluorine containing gases, are introduced into the chamber 140 from the remote plasma source 150A through the side ports.

The system 100 is coupled to a controller 102 comprising a central processing unit (CPU) 106, a memory 108, and support circuits 110. The controller 102 is coupled to the pumping system 104 and cleaning system 150 along with various other components of the HDP-CVD system 100 to facilitate control of the deposition and cleaning processes.

In operation, the semiconductor substrate 130 depicted in FIG. 1 is placed on the substrate support member 116. The chamber 140 is then evacuated using the rough pump 160 to first achieve an initial vacuum level, at which time the turbomolecular pump 162 is activated and the gate valve 158 is opened to further reduce the vacuum level to the desired vacuum level. Gaseous components are supplied from a gas panel 170 to the process chamber 140 through entry ports 124 to form a gaseous mixture. The gaseous mixture is ignited into a plasma in the process region 120 by applying RF power from the RF sources and respectively to the top coil 172, the side coil 174, and the substrate support member 116. Alternately, the gaseous mixture may ignited by other methods or not ignited at all. The pressure within the interior of the chamber 140 is controlled using the throttle valve 164 situated between the pumping port 154 and the turbomolecular pump 162. The temperature at the surface of the chamber walls 118 is controlled using liquid-containing conduits (not shown) that are located in the walls 118 of the process chamber 140.

To facilitate control of the system 100 as described above, the CPU 106 may be one of any form of general purpose computer processor that can be used in an industrial setting for controlling various chambers and subprocessors. The memory 108 is coupled to the CPU 106. The memory 108, or computer-readable medium, may be one or more of readily available memory such as random access memory (RAM), read only memory (ROM), floppy disk, hard disk, or any other form of digital storage, local or remote. The support circuits 110 are coupled to the CPU 106 for supporting the processor in a conventional manner. These circuits include cache, power supplies, clock circuits, input/output circuitry and subsystems, and the like. A cleaning process 200 of the present invention is typically implemented by the CPU 106 and is generally stored in the memory 108 as part of a software routine. The software routine is discussed below with respect to FIG. 2. The software routine may also be stored and/or executed by a second CPU (not shown) that is remotely located from the hardware being controlled by the CPU 106.

Figure 2:
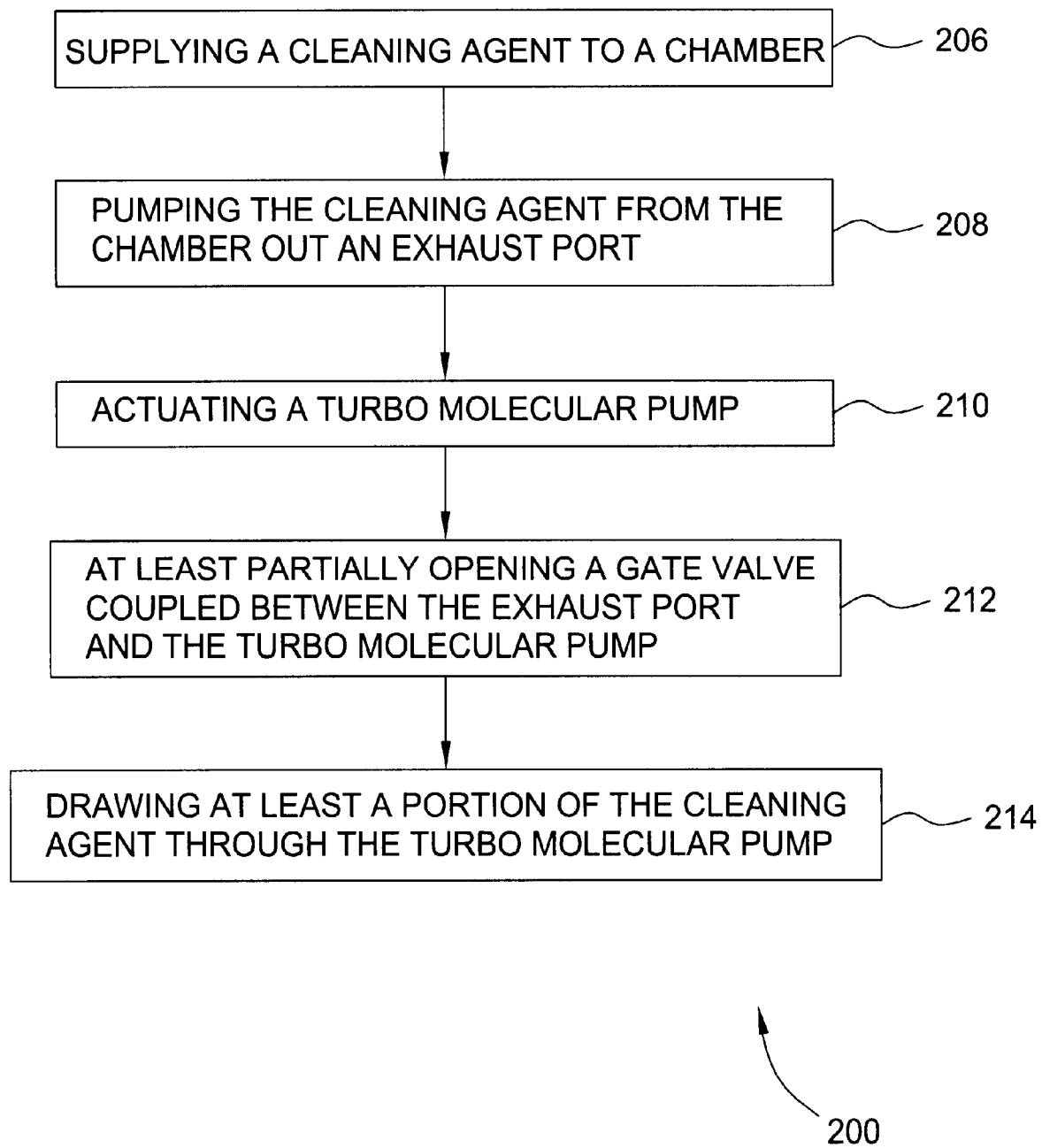
FIG. 2 is a flow diagram of the process of the present invention.

The cleaning process 200 is depicted in greater detail in FIG. 2. The cleaning process 200 comprises the steps of supplying a cleaning agent to the chamber 140 (step 206), pumping the cleaning agent from the chamber 140 through the pumping port 154 (step 208), activating the turbomolecular pump 162 (step 210), at least partially opening the gate valve 158 (step 212), and drawing at least a portion of the cleaning agent through the turbomolecular pump 162 (step 214).

Referring simultaneously to FIG. 1 and FIG. 2, the software routine when executed by the CPU 106, transforms the general purpose computer into the specific purpose computer (controller) 102 that controls the chamber operation such that the deposition process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

More specifically, the semiconductor process system 100 is cleaned, for example, by first supplying the cleaning agent comprising a gas containing elemental or disassociated fluorine from the cleaning system 150 to the chamber 140 in step 206. The cleaning agent is then pumped out the pumping port 154 by the rough pump 160 in step 208. The turbomolecular pump 162 is activated in step 210. The gate valve 158 is at least partially opened and at least a portion of the cleaning agent is drawn through the turbomolecular pump 162 in steps 212 and 214, respectively.

The cleaning agent reacts with and removes the contaminants from the turbomolecular pump 162. The cleaned turbomolecular pump 162 is then able to maintain substantially consistent and repeatable vacuum levels until new contamination forms within the turbomolecular pump 162, necessitating a new cleaning cycle.

Although the teachings of the present invention that have been shown and described in detail herein, those skilled in the art can readily devise other varied embodiments that still incorporate the teachings and do not depart from the spirit of the invention.

What is claimed is:

1. A method for cleaning a semiconductor process chamber comprising the steps of:

removing a processed substrate from the chamber;

supplying a cleaning agent to said chamber;

pumping said cleaning agent from the chamber;

at least partially opening a gate valve coupled between said chamber and a turbomolecular pump coupled in parallel; and drawing at least a portion of said cleaning agent through said turbomolecular pump.

2. The method of claim 1, wherein said drawing step comprises the step of:

activating said turbomolecular pump.

3. The method of claim 1, wherein said cleaning agent comprises elemental or disassociated fluorine.

4. The method of claim 1, wherein said supplying step comprises the step of:

supplying said cleaning agent from a remote plasma source.

5. The method of claim 1, wherein said supplying step comprises the step of:

supplying said cleaning agent from a gas panel.

6. A method for cleaning a semiconductor process chamber, comprising:

supplying a cleaning agent to a deposition chamber;

pumping said cleaning agent from the deposition chamber through a pumping system having a turbomolecular pump and roughing pump coupled in parallel;

partially opening a valve coupled between said deposition chamber and the turbomolecular pump of the pumping system; and drawing at least a portion of said cleaning agent through said turbomolecular pump.

7. The method of claim 6, wherein said supplying step occurs after the steps of:

depositing a layer of material on a substrate; and removing the substrate from the deposition chamber.

8. The method of claim 6, wherein said drawing step comprises the step of:

activating said turbomolecular pump.

9. The method of claim 6, wherein said cleaning agent comprises elemental or disassociated fluorine.

10. The method of claim 6, wherein said supplying step comprises the step of:

supplying said cleaning agent from a remote plasma source.

11. The method of claim 6, wherein said supplying step comprises the step of:

supplying said cleaning agent from a gas panel.

12. The method of claim 6 further comprising:

drawing a portion of said cleaning agent through the roughing pump.

* * * * *